(12) United States Patent
Boecker et al.

(10) Patent No.: US 7,599,396 B2
(45) Date of Patent: Oct. 6, 2009

(54) METHOD OF ENCODING AND SYNCHRONIZING A SERIAL INTERFACE

(75) Inventors: Charles Boecker, Ames, IA (US); Scott Irwin, Ames, IA (US); Matthew Shafer, Ankeny, IA (US); Eric Groen, Ankeny, IA (US); Aaron Hoelscher, Ankeny, IA (US); Andrew Jenkins, Nevada, IA (US); David Black, Story City, IA (US)

(73) Assignee: Magnalynx, Inc., Ames, IA (US)

( * ) Notice: Subject to any disclaimer, the term of this patent is extended or adjusted under 35 U.S.C. 154(b) by 931 days.

(21) Appl. No.: 11/178,958

(22) Filed: Jul. 11, 2005

(65) Prior Publication Data

US 2007/0008992 A1    Jan. 11, 2007

(51) Int. Cl.
*H04J 3/06* (2006.01)
(52) U.S. Cl. ...................................... 370/474; 370/503
(58) Field of Classification Search ................. 370/471, 370/474, 503; 714/52, 798
See application file for complete search history.

(56) References Cited

U.S. PATENT DOCUMENTS

| | | | | |
|---|---|---|---|---|
| 4,599,723 A | * | 7/1986 | Eck | 714/798 |
| 5,568,482 A | * | 10/1996 | Li et al. | 370/471 |
| 6,650,140 B2 | * | 11/2003 | Lee et al. | 326/39 |
| 6,693,985 B2 | | 2/2004 | Li et al. | |
| 6,731,683 B1 | | 5/2004 | Fiedler et al. | |
| 6,738,917 B2 | | 5/2004 | Hummel et al. | |
| 6,738,942 B1 | | 5/2004 | Sridharan et al. | |
| 6,747,580 B1 | * | 6/2004 | Schmidt | 341/50 |
| 6,750,675 B2 | | 6/2004 | Venkata et al. | |
| 6,754,238 B1 | | 6/2004 | Lentine et al. | |
| 6,757,327 B1 | | 6/2004 | Fiedler | |
| 6,777,979 B1 | | 8/2004 | Zhu et al. | |
| 6,804,805 B2 | * | 10/2004 | Rub | 714/752 |
| 7,103,830 B1 | * | 9/2006 | Dong | 714/784 |

* cited by examiner

*Primary Examiner*—Jayanti K Patel
*Assistant Examiner*—Matthew Campbell
(74) *Attorney, Agent, or Firm*—Toler Law Group

(57) ABSTRACT

The present disclosure is generally directed to a method of communicating data between two or more semiconductor devices. Serial interfaces using the method have a reduction in latency compared to conventional serial interfaces. The method enables features needed for a serial interface, such as limited run lengths and recognizable data boundaries to establish alignment. In addition, a method for synchronizing two or more semiconductor devices through serial interfaces has been presented. This is done by passing a marker data pattern through the system.

7 Claims, 5 Drawing Sheets

METHOD OF ENCODING AND SYNCHRONIZING A SERIAL INTERFACE

FIELD OF THE DISCLOSURE

The disclosure is generally related to chip-to-chip serial interfaces between semiconductor devices

BACKGROUND

As semiconductor device speeds increase, there is a desire for the bandwidth of communication between semiconductor devices to increase. The available bandwidth is determined at least in part by the interface to the semiconductor devices. One type of common interface to a semiconductor device is a parallel interface. Parallel interfaces often experience transmission problems at higher frequencies.

There are several serial interfaces that offer higher bandwidth compared to parallel interfaces, but at the sacrifice of increased latency. Accordingly, there is a need for a serial interface that offers a higher bandwidth, but with little or no increase in latency compared to a parallel interface.

DETAILED DESCRIPTION OF THE DRAWINGS

The present disclosure is generally directed to a method of communicating data between two or more semiconductor devices. Serial interfaces using the disclosed method have a reduction in latency compared to conventional serial interfaces due to use of a particular data encoding scheme. The method enables features needed for a serial interface, such as limited run lengths and recognizable data boundaries to establish alignment.

Figure 1:
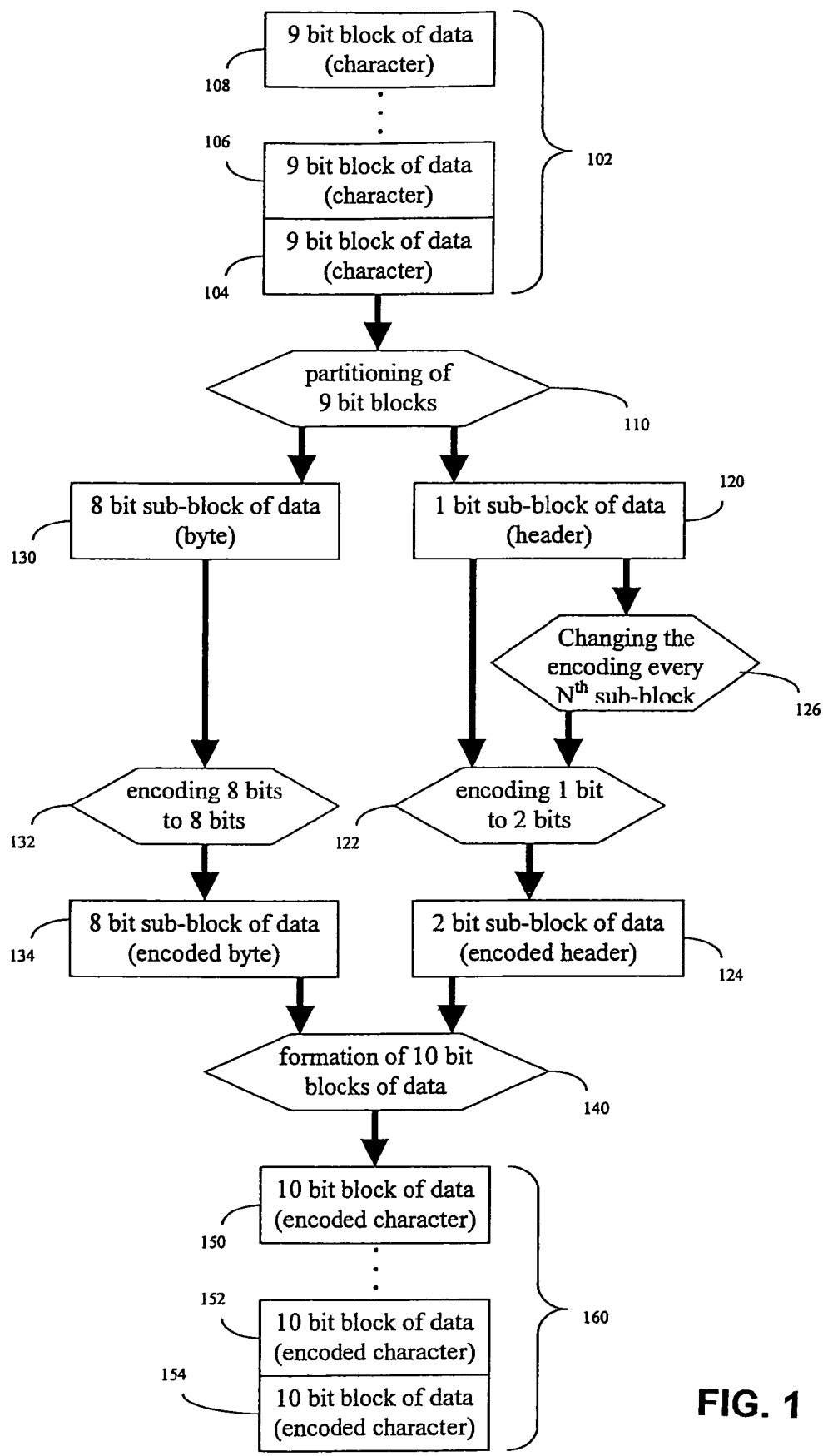
FIG. 1 is a flow diagram that illustrates an exemplary encoding process.

Referring to FIG. 1, a method of encoding data is shown that receives unconstrained data 102 as input and returns run length limited data 160 as an output. The unconstrained input data 102 is further comprised of nine bit blocks of data called characters 104, 106, and 108. The encoder processes these characters by partitioning, as shown at 110, the characters into eight bit sub-blocks called bytes 130 and one bit sub-blocks called headers 120. The bytes are encoded, at 132, into new eight bit sub-blocks called encoded bytes 134. The headers are encoded, at 122, into two bit sub-blocks called encoded headers 124. As shown at 126, the encoding of the headers changes periodically, such as every $N^{th}$ header that is encoded. In a particular embodiment, every $128^{th}$ header is encoded differently than the other headers. The encoded headers 124 and the encoded bytes 134 are grouped together, at 140, to form the run length limited data output 160 including a plurality of encoded characters, 150, 152, and 154. The encoded characters possess characteristics that make them suitable for transmission across a serial interface.

Figure 2:
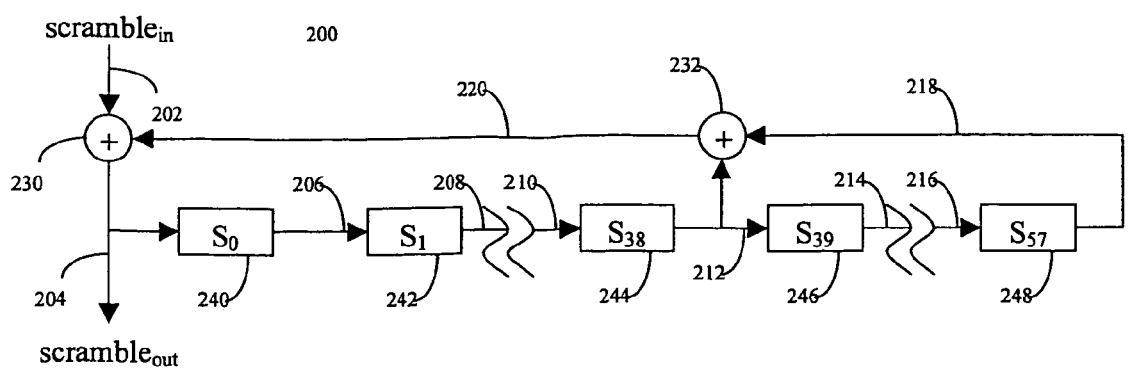
FIG. 2 is a functional diagram that illustrates a self-synchronizing scrambler implementing an exemplary polynomial.

FIG. 2 is a function block diagram that illustrates a particular implementation of a self synchronizing scrambler 200 using the polynomial $1+X^{39}+X^{58}$. This scrambler is one particular embodiment of a system to perform byte encoding 132 as shown with respect to FIG. 1. The scrambler 200 operates on one bit of data at a time. A scrambler input 202 is coupled to a two input XOR 230. The output of the XOR 230 is the scrambler output 204. The output of the scrambler 204 is also stored within the scrambler, through storage devices 240, 242, 244, 246, and 248 to scramble later received bits of data. It should be noted that many storage devices of the scrambler 200 are not specifically shown in FIG. 2. For example, storage registers between connections 208 and 210 and between connections 214 and 216 are not shown to simplify the figure. The updates of the storage registers are synchronized to the timing of the output data 204 of the scrambler. Connections between the registers 206, 208, 210, 212, 214, and 216 provide proper shifting of the data through the scrambler 200. Since the polynomial is $1+X^{39}+X^{58}$, the outputs of the $39^{th}$ register ($s_{38}$) 244 and the $58^{th}$ register ($S_{57}$) 248 are XORed together at XOR device 232. The output 220 of XOR device 232 is XORed with the input 202 in a feedback path, to produce a scrambled output with the desired polynomial.

Figure 3:
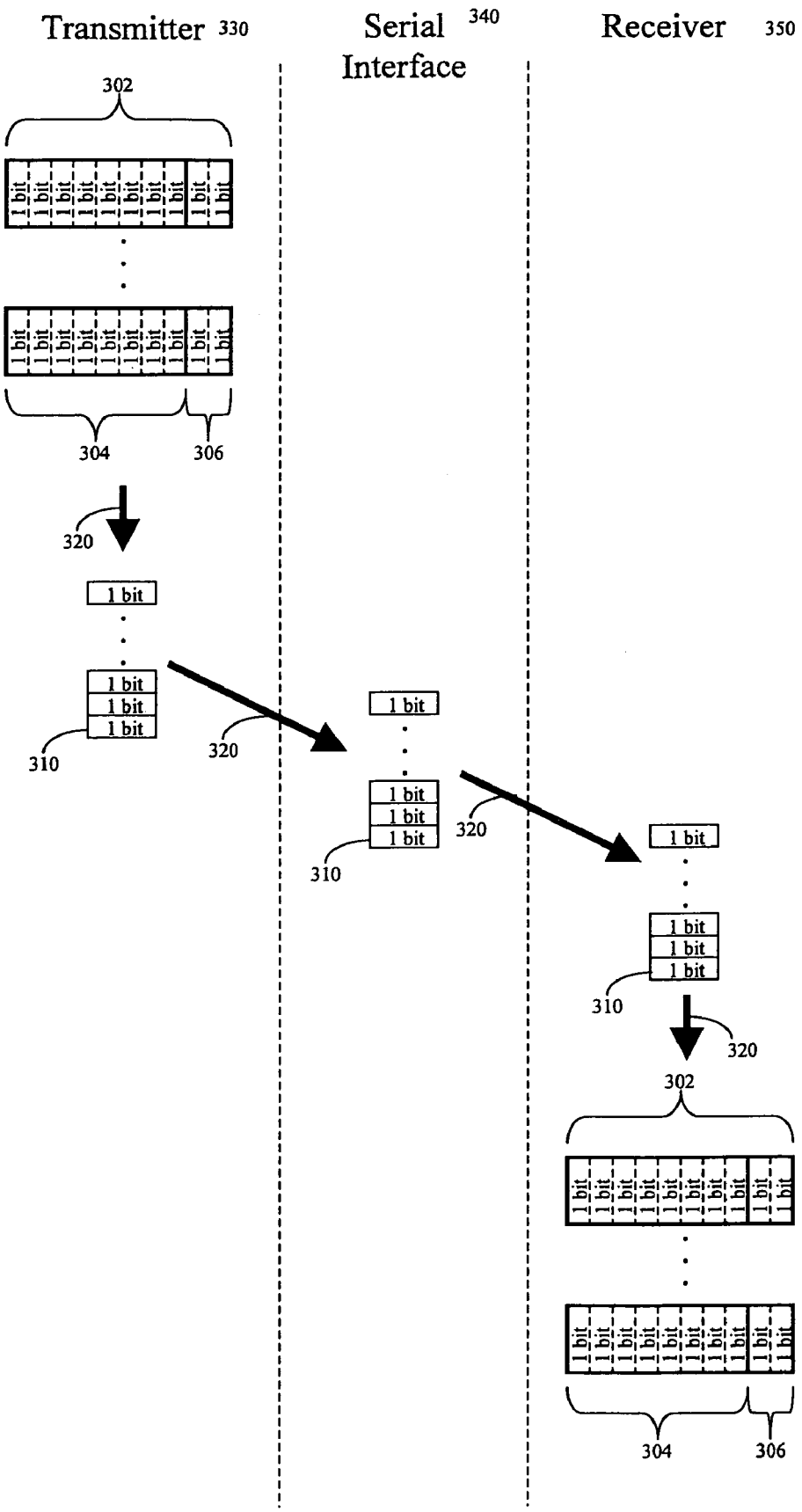
FIG. 3 is a general diagram that illustrates use by a single serial interface of the encoding process of FIG. 1 to transfer data between semiconductor devices.

FIG. 3 illustrates alignment to an encoded character (10 bit boundary) and a frame (N*10 bit boundary) using the encoding method described in FIG. 1. FIG. 3 is separated into three different sections. The transmitter section shows data events occurring in the sending device. Serial channel events are shown in the serial channel section. The events that occur in the receiving device are shown in the receiver section. Time progresses in the figure from top to bottom, so events that occur first are at the top. Events are separated by arrows 320. Encoded characters 302 are sent to the transmitter from a logic device. The encoded characters are made up of encoded bytes 304 and encoded headers 306. The encoded characters are transformed into a serial stream of bits 310. These bits are sent across the serial channel to the receiver. After the reception of the bits, an algorithm in the receiver searches for specific patterns within the serial stream of bits. These patterns define where encoded character and frame boundaries occur. Once these patterns are located, the serial interface is aligned accordingly. The same encoded characters 302 that were sent from the transmitter are formed at the receiver. The alignment described applies to a system with one or more transmitters and one or more receivers.

Figure 4:
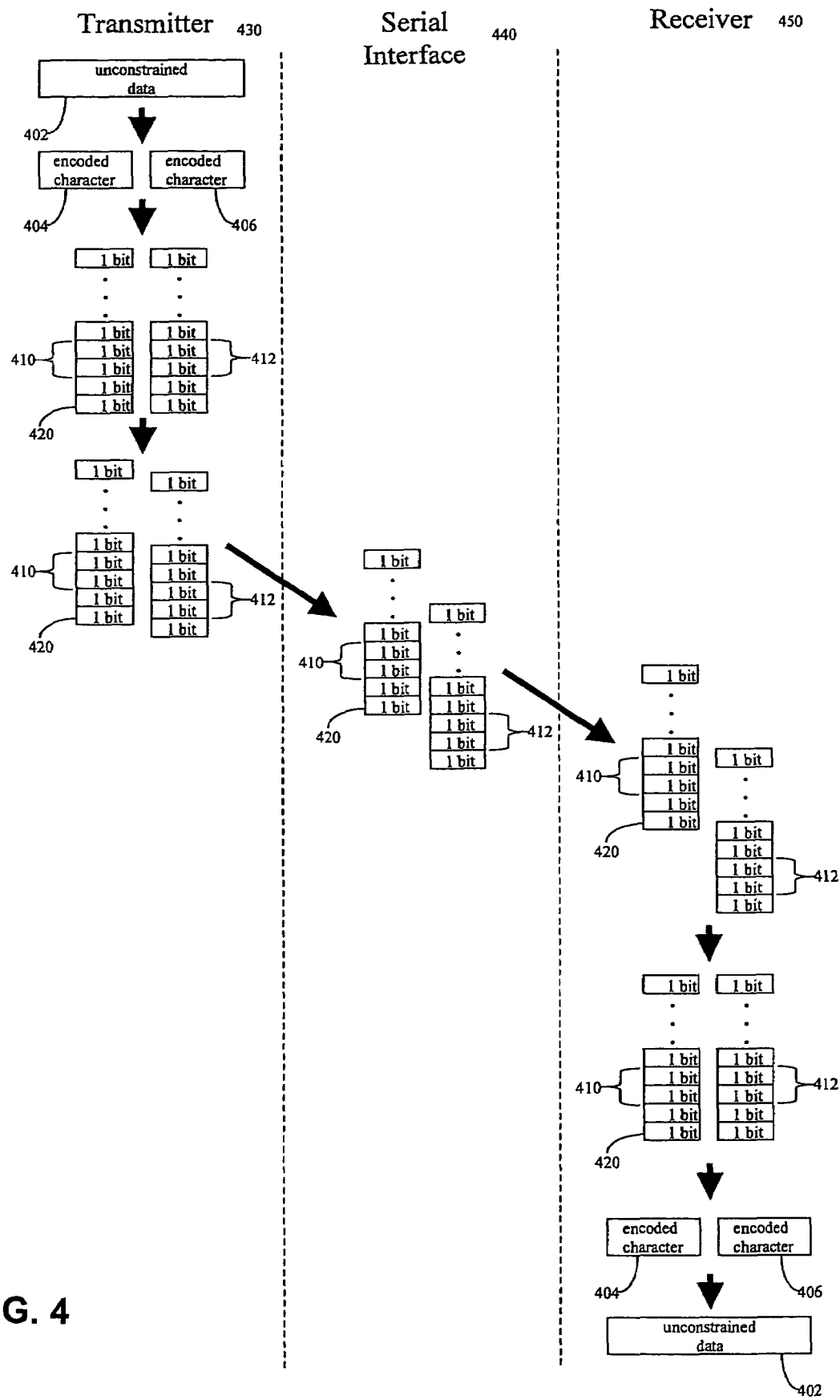
FIG. 4 is a diagram that illustrates use by multiple serial interfaces of the encoding process of FIG. 1 to transfer data.

FIG. 4 illustrates alignment in a system with a plurality of serial channels. The figure follows the same conventions described in FIG. 3 in terms of separation of the sections, separation of the events, and time progression. Unconstrained data 402 enters the transmitter section. This data is divided into separate paths and encoded into encoded characters 404 and 406. The number of paths that the unconstrained data 402 is divided into depends on the number of serial channels. In this case, there are two serial channels, so the data is divided into two separate paths. The encoded characters are converted into serial streams. The serial streams are made of bits 420. Markers 410 and 412 are used to provide proper alignment of the data at the receiver. As the data passes through the serial channels, the markers may become misaligned. Each receiver performs the alignment as described in FIG. 3 on its respective serial stream. In addition, the markers 410 and 412 embedded in the serial stream are aligned to each other. After this occurs, valid data can be reconstructed in the form of encoded characters 404 and 406 and, finally, into the original data sent 402.

Figure 5:
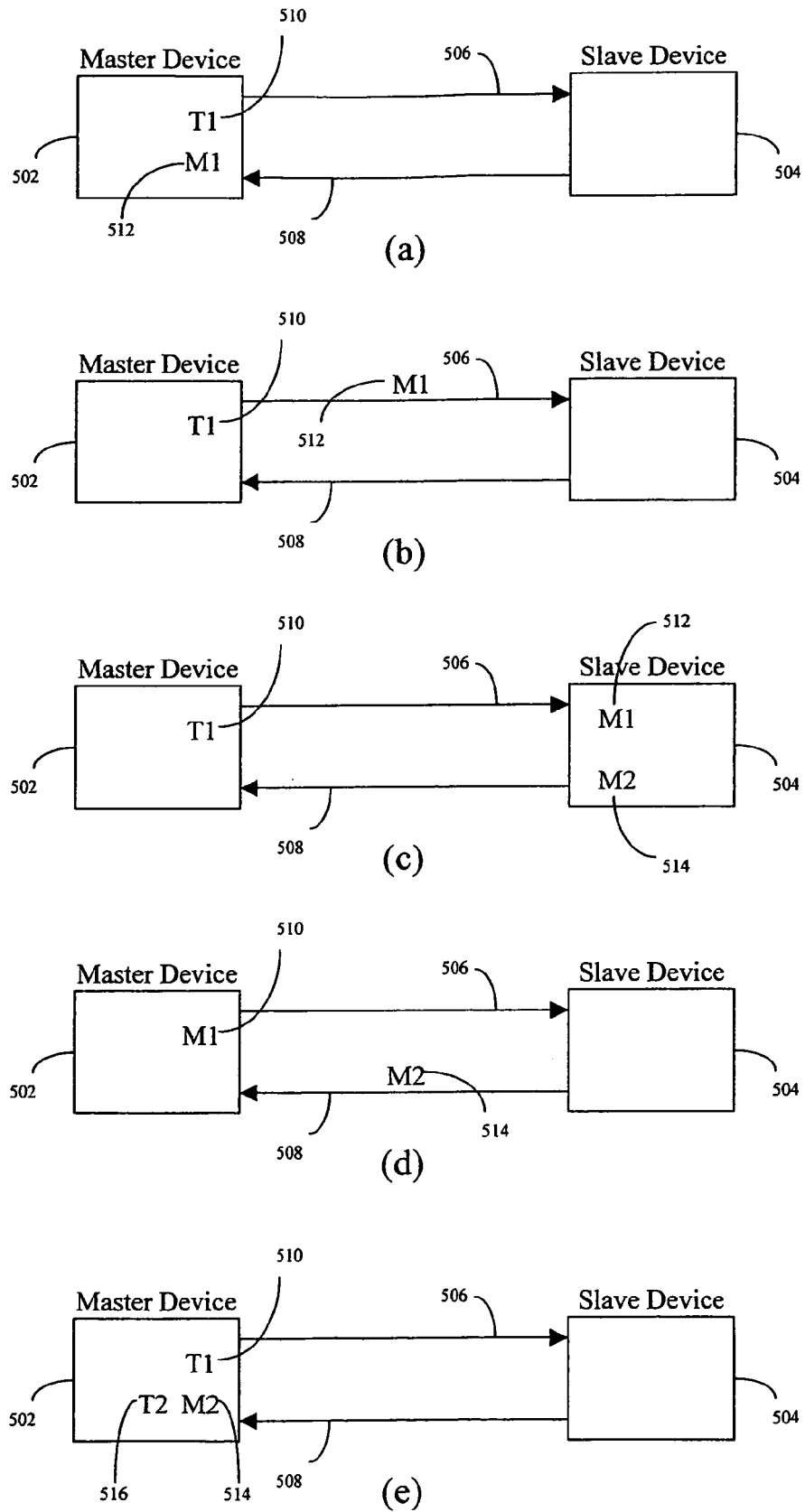
FIGS. 5A-5E illustrate synchronizing two semiconductor devices through their serial interfaces.

FIG. 5 describes a method for synchronizing two semiconductor devices using serial interfaces. The figure shows how synchronization of two semiconductor devices is achieved by looking at five different events. (FIG. 5a) At the beginning of a synchronization event 510, T1, a marker 512, M1, is generated by the master device 502. (FIG. 5b) Marker 512, M1, represents a specific data pattern that is sent out of the master device 502 on the downstream serial interface 506. (FIG. 5c) When the slave device 504 receives marker 512, M1, it then generates a second marker 514, M2. (FIG. 5d) The marker 514, M2, represents a specific data pattern that is sent out of the slave device 504 on the upstream serial interface 508. (FIG. 5e) Synchronization event 516, T2, occurs when the master device 502 receives marker 514, M2. T1, 510, represents the time the synchronization event started and T2, 516, represents the time the synchronization event finished. The difference between T1, 510, and T2, 516, is used to synchronize the two semiconductor devices. This method can be expanded to a system containing more than two semiconductor devices with any combination and configuration of slave and master devices. It should be noted that a single device can be both a slave and a master. The device can be a slave to a particular semiconductor device and a master to a different semiconductor device. The master device is defined as where a synchronization event originates and terminates. The slave device is defined as taking part in a synchronization event, but not being the origination or termination of the event.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of producing encoded data for communication over a serial interface, the method comprising:

receiving an input data stream including a plurality of nine-bit data blocks;

partitioning each of the plurality of nine-bit data blocks into a first sub-block comprising one bit, a header, and a byte that includes a second sub-block of eight bits;

for periodically selected headers, encoding the header to create a two-bit frame header comprising the header and a copy of the header;

for other headers, encoding the header to create a two-bit transition header comprising the header and the inverse of the header;

for each of the bytes, encoding the byte to create an encoded byte that includes an eight-bit encoded sub-block;

creating an output data stream that includes a plurality of data segments, each of the plurality of data segments including:

one of the frame headers or one of the transition headers; and one of the encoded bytes;

wherein each of the data segments comprises ten bits; and communicating the output data stream over one or more serial interfaces.

2. The method of claim 1, wherein a periodic selection associated with the periodically selected headers is based on a period of N, wherein N is equal to 128.

3. The method of claim 1, wherein each of the bytes is encoded using a data scrambler.

4. The method of claim 3, wherein the data scrambler is a recoverable scrambler based on a polynomial.

5. The method of claim 1, wherein the transition headers and frame headers identify corresponding ten-bit boundaries, and wherein only the frame headers identify N*10-bit boundaries.

6. A plurality of serial interfaces using the method of claim 1 to encode data streams including data sent across the serial interfaces, wherein corresponding frame headers in the data streams are used to align the data streams to each other.

7. The method of claim 1, wherein a first subset of the plurality of data segments forms a synchronization marker data pattern and a second subset of the plurality of data segments forms a second synchronization marker data pattern.

* * * * *